United States Patent

Nguyen et al.

Patent Number: 6,048,652
Date of Patent: Apr. 11, 2000

[54] BACKSIDE POLISH EUV MASK AND METHOD OF MANUFACTURE

[75] Inventors: Khanh B. Nguyen, San Mateo; Craig Sander, Mountain View, both of Calif.

[73] Assignee: Advanced Micro Devices, Inc., Sunnyvale, Calif.

[21] Appl. No.: 09/205,791

[22] Filed: Dec. 4, 1998

[51] Int. Cl.$^7$ ........................................... G03F 9/00
[52] U.S. Cl. ................................................ 430/5
[58] Field of Search .............................. 430/5, 322, 323; 378/35, 34

[56] References Cited

U.S. PATENT DOCUMENTS

| | | | |
|---|---|---|---|
| 4,536,882 | 8/1985 | Jones et al. | 378/35 |
| 4,539,278 | 9/1985 | Williams et al. | |
| 4,604,292 | 8/1986 | Evans et al. | |
| 5,199,055 | 3/1993 | Noguchi et al. | |
| 5,310,603 | 5/1994 | Fukuda et al. | |
| 5,399,448 | 3/1995 | Nagata et al. | |
| 5,549,994 | 8/1996 | Watanabe et al. | 430/5 |
| 5,572,564 | 11/1996 | Murakami | |
| 5,698,113 | 12/1997 | Baker et al. | |

OTHER PUBLICATIONS

"EUV Reticle Pattern Repair Experiments using 10 KeV Neon Ions", A. M. Hawryluk, D. R. Kania, P. Celliers, L. DaSilva, A. Stith, D. Stewart, and Mrowka; OSA Proceedings on Extreme Ultraviolet Lithography, 1994, vol. 23, 5 pages.

"Trends in Optics and Photonics", Extreme Ultraviolet Lithography, OSA Optical Society of America, TOPS vol. IV, 6 pages.

"SolidState Technoogy", The International Magazine for Semiconductor Manufacturing, Jul. 1997, vol. 40, No. 7, 6 pages.

"SolidState Technology", The International Magazine for Semiconductor Manufacturing, Aug. 1997, vol. 40, No. 8, 4 pages.

"Mask technologies for soft–x–ray projection lithography at 13 nm", Applied Optics. Dec. 1, 1993, vol. 32, No. 34, 5 pages.

"Optical Fabrication and Testing", 1996 Technical Digest Series, vol. 7, 5 pages.

"Silicon–On–Insulator by Wafer Bonding: A Review", J. Electrochem. Soc., vol. 138, No. 1 Jan. 1991, The Electrochemical Society, Inc., 7 pages.

*Primary Examiner*—S. Rosasco
*Attorney, Agent, or Firm*—Amin, Eschweiler & Turocy, LLP

[57] ABSTRACT

A method (100) of forming a reflective reticle blank includes forming (106) a reflective layer (108) over a flat substrate (104) and coupling a low thermal expansion material (112) to the reflective layer (108). After coupling the low thermal expansion material (112) to the reflective layer (108), the flat substrate (104) is removed. By forming the reflective layer (108) on the flat substrate (104), a low-defect, high reflectivity reflective layer (108) is formed. In addition, by removing the flat substrate (104), the reticle blank uses the low thermal expansion material (112) as substrate and exhibits minimized distortion during processing due to its low thermal expansion material.

23 Claims, 3 Drawing Sheets

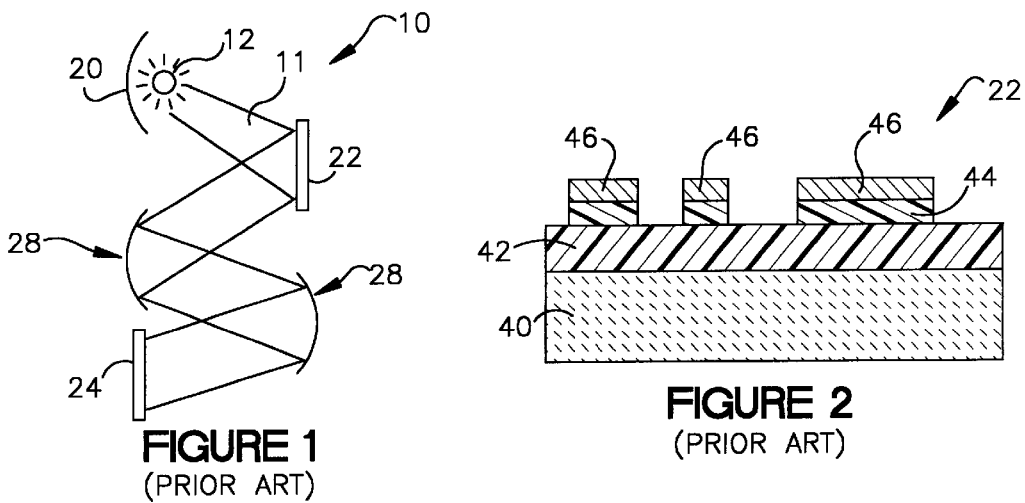
FIGURE 1
(PRIOR ART)
FIGURE 2
(PRIOR ART)
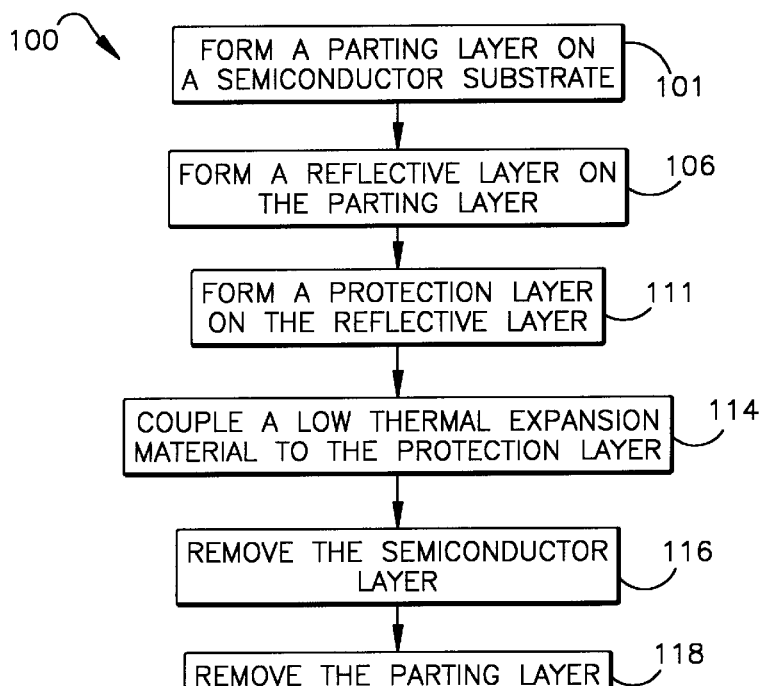
FIGURE 3
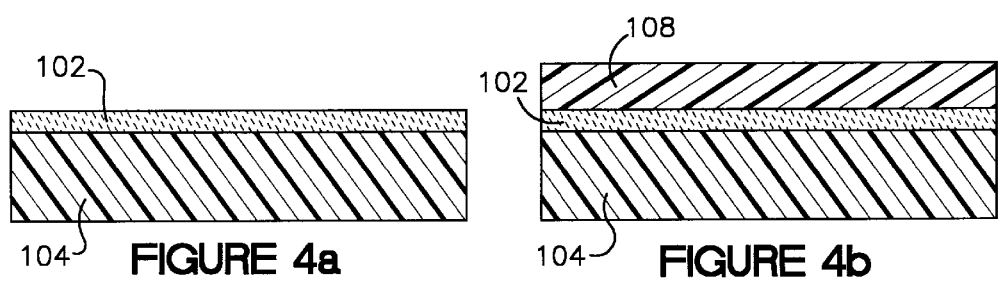
FIGURE 4a  FIGURE 4b

BACKSIDE POLISH EUV MASK AND METHOD OF MANUFACTURE

FIELD OF THE INVENTION

The present invention generally relates to lithography and more particularly relates to a method of fabricating an EUV mask blank having a low defect reflective coating and a low thermal expansion substrate.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the surface through an intervening master template (e.g., a mask or reticle) to generate a particular pattern. The exposed pattern on the photoresist is then developed with a solvent called a developer which makes the exposed pattern either soluble or insoluble depending on the type of photoresist (i.e., positive or negative resist). The soluble portions of the resist are then removed, thus leaving a photoresist mask corresponding to the desired pattern on the wafer for further processing.

Projection lithography is a powerful and important tool for integrated circuit processing. As feature sizes continue to decrease, optical systems are approaching their limits caused by the wavelengths of the optical radiation being utilized. A recognized way of reducing the feature size of circuit elements is to lithographically image them with radiation of a shorter wavelength. "Soft" x-rays (a.k.a, extreme ultraviolet (EUV) radiation) having a wavelength range of about 50 to 700 Angstroms (i.e., about 5 to 70 nm) is now being investigated as an alternative photolithography methodology for next generation integrated circuits in an effort to achieve the desired smaller feature sizes.

EUV lithography may be carried out, for example, in an EUV lithography system 10 as illustrated in prior art FIG. 1. EUV radiation 11 is generated, for example, by a light source 12. A reflective condenser optical system 20 collects the EUV radiation 11 and projects the radiation 11 onto a reflective reticle 22.

The reticle 22 contains a pattern which is to be transferred to a photoresist-covered substrate 24. The reflective reticle 22 reflects a portion of the EUV radiation 11 and absorbs another portion of the EUV radiation 11 corresponding to the pattern thereon. The reflected EUV radiation 11 therefore carries the desired pattern to a reflective imaging system 28 (e.g., a series of high precision mirrors) which projects a de-magnified or reduced image of the reticle pattern onto the resist-coated substrate 24. The entire reticle pattern is generally exposed onto the substrate 24 by scanning the reticle 22 and the substrate 24 (e.g., a step and scan exposure system).

The reticle 22 of prior art FIG. 1 is an important component in the EUV lithography system 10. Unlike conventional UV lithography systems which predominately use refractive optics, many EUV lithography systems, such as the system 10 of prior art FIG. 1, utilize reflective optics. Consequently, the reticle 22 is a reflective reticle and therefore reflects the incident EUV radiation 11 to form a pattern as opposed to transmitting portions of the radiation therethrough. An exemplary reflective reticle 22 is illustrated in prior art FIG. 2. The reflective reticle 22 includes a substrate 40 such as silicon or glass having a reflective layer 42 formed thereon. The reflective layer 42 is typically a multilayer coating which is designed to reflect the EUV radiation with a high efficiency (e.g., about 65% or more). The reflective layer 42 is covered with a buffer layer 44 (e.g., silicon) which may be used to protect the reflective layer 42 and help prevent oxidation of the reflective layer 42 during subsequent processing or pattern repair. Lastly, a thin layer of EUV absorptive material (e.g., silver, tungsten, gold, tantalum, titanium, lead, polyimide, polymethyl methacrylate (PMMA), etc.) is deposited and patterned to form the desired reticle pattern 46.

The reticle blank, consisting of the substrate 40 and the reflective coating 42, is an important component in the EUV lithography system 10. The reflective coating 42 typically contains many individual reflective layers (and for this reason is often called a multilayer film or coating) which must be substantially defect free in order to provide the high reflectance needed to provide a high-throughput, cost-effective lithography system. The reflective coating 42 may include, for example, eighty (80) layers of alternating molybdenum and silicon, each having a thickness of about 3–4 nm. Because the reflectivity of the reflective coating 42 is an important performance parameter and since defects in the multilayer coating 42 negatively impact the reflectivity, the manner in which the reticle blank is fabricated is important.

In the formation of conventional reflective reticle blanks for EUV lithography systems, a performance trade-off exists. In order to provide defect-free, highly reflective coatings for the reflective layer 42, each layer within the multilayer film 42 must have a low surface roughness (e.g.,within about ±0.1 nm). Consequently a smooth substrate 40 such as silicon is highly desirable in order to facilitate such film thickness control during the formation of the individual reflective layers. In addition, because the reflective coating 42 only reflects about 65% of the EUV radiation, the remaining radiation is absorbed by the reticle 22 which causes the reticle 22 to heat up during processing. Consequently, in order to reduce distortion and performance degradation associated with the reticle heating (e.g., pattern overlay error), a low thermal expansion substrate such as an ultra low expansion glass is desirable.

Silicon, which facilitates the formation of high quality multilayer coatings due to its flatness, unfortunately exhibits a large coefficient of thermal expansion (e.g.,up to 2 ppm/° C.) and thus exhibits undesirably large distortion due to the absorption of EUV radiation during processing. For example, across a typical 100 mm image field, a 0.5° C. deviation in temperature will result in a registration error of 100 nm, in circumstances where less than 10 nm is desired. Likewise, the ultra low expansion glass, although not experiencing substantial distortion during processing, does contain an undesirably high number of surface defects (e.g., scratches) which undesirably create defects in the multilayer reflective coating 42 during the formation of the coating. Because the thickness of the various individual layers within the reflective coating 42 are preferably controlled within about ±0.1 nm, and the defects on the glass substrate surface may be greater than 0.1 nm, the substrate surface defects create noise in the various reflective layers, thus substantially degrading the reflectivity of the reflective coating 42. Therefore the prior art reticle blanks exhibit a performance trade-off between smooth substrates for high quality reflective layers provided by silicon substrates and low thermal expansion characteristics for minimized distortion during processing provided by glass substrates.

Therefore there is a need in the art for EUV reticle blanks which provide high quality reflectivity with minimized distortion during processing exposure.

SUMMARY OF THE INVENTION

The present invention relates to a method of making a reflective reticle blank which exhibits a high reflectivity associated with a reflective layer which has been formed on a flat substrate such as a semiconductor material while concurrently exhibiting a minimal distortion during processing exposure associated with a low thermal expansion substrate material such as glass.

More particularly, the present invention relates to a method of forming a reflective reticle blank including the formation of a reflective layer over a flat substrate such as silicon. The flatness of the flat substrate facilitates the formation of a high reflectivity reflective layer. After formation of the reflective layer, a low thermal expansion material such as glass is coupled to the reflective layer and the flat substrate is removed. The resulting reflective reticle blank exhibits high reflectivity while simultaneously exhibiting minimized distortion during processing exposure due to the low thermal expansion material acting as the reticle substrate, thus overcoming the performance trade-off of prior art reticle blanks.

According to one aspect of the present invention, a method of forming a reflective reticle blank includes forming a parting layer such as an oxide over a flat semiconductor substrate such as silicon. The parting layer serves to protect the reflective layer from damage when the flat substrate is subsequently removed and can also be easily removed without negatively impacting the reflective layer. A reflective layer such as a molybdenum/silicon multilayer film is then formed over the semiconductor substrate and a protection layer such as an oxide is then formed over the reflective layer. The protection layer serves to protect the reflective layer during a subsequent processing step in which a low thermal expansion material is attached to the reticle blank.

Once the protection layer is formed over the reflective layer, a low thermal expansion material such as glass is coupled to the protection layer via, for example, a bonding process and the flat substrate and the parting layer are removed, thus leaving the reflective layer overlying the low thermal expansion material substrate with the protection layer disposed there between. Due to the excellent flatness characteristics of the semiconductor substrate, a high quality, low-defect reflective layer may be readily formed. In addition, by attaching the low thermal expansion substrate to the reflective layer and then removing the flat semiconductor substrate (i.e., back-side bonding), the resulting reticle blank exhibits both high reflectivity and low distortion during processing exposure, thus overcoming the heretofore reticle blank design trade-off of prior art reticle blanks. Lastly, the back-side bonding eliminates or substantially reduces the negative impact of any defect propagation in the reflective layer. Due to the back-side bonding, the propagation of a defect in one of the reflective layers which make up the reflective layer occurs in a direction away from a top of the reflective surface. Because a significant contribution of the reflectivity of the reflective layer is due to the top layers thereof, the impact of any defect propagation is substantially attenuated, thus reducing the printability of the defects in the reflective layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a perspective view of a prior art EUV reflective lithography system;

FIG. 2 is a cross section diagram illustrating a prior art reflective EUV reticle;

FIG. 3 is a flow chart illustrating a method of making a reflective reticle blank according to the present invention;

FIGS. 4a–4g are cross section diagrams illustrating the steps in making the reflective reticle blank of the present invention in accordance with the method of FIG. 3.

DETAILED DESCRIPTION OF THE INVENTION

Figure 4C:
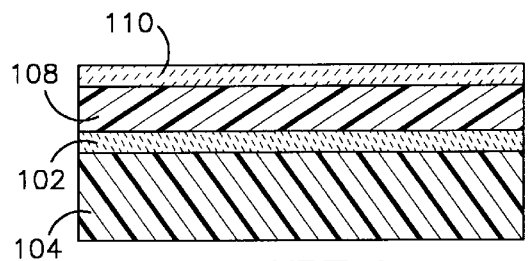

The following is a detailed description of the present invention made in conjunction with the attached Figures, wherein like reference numerals will refer to like elements throughout. The present invention includes a method of making a reflective reticle blank for use, for example, in EUV reflective lithographic printing systems. The present invention overcomes the performance trade-off between a high quality reflective layer and low reticle distortion during processing exposure exhibited by prior art reticle blanks. The trade-off is overcome by forming the reflective layer over a flat substrate which facilitates the formation of a low-defect reflective layer which desirably provides high reflectivity and then coupling a low thermal expansion material to the reflective layer. The flat substrate is then removed, leaving the reflective layer overlying the low thermal expansion material which then acts as the reticle substrate. The resulting reticle blank thus exhibits the high reflectivity of reticle blanks having a silicon substrate and the low distortion of glass substrates and thus overcomes the heretofore performance tradeoff of prior art reticle blanks.

Referring to the Figures, FIG. 3 is a flow chart illustrating a method 100 of manufacturing a reflective reticle blank according to the present invention which will be discussed in conjunction with the cross section diagrams of FIGS. 4a–4g. The method 100 includes a step 101 of forming a parting layer 102 on a substantially flat substrate 104, such as silicon, as illustrated in FIG. 4a. A substantially flat substrate 104 is desirable in order to fabricate a high quality reflective layer for the reticle blank, the details of which will be discussed in greater detail infra. According to a preferred embodiment of the present invention, the substrate roughness is less than about 3 Angstroms rms. Because silicon provides the desired flatness and may be processed according to well known processing techniques, silicon is the preferred substrate material 104. Alternatively, however, other semiconductor materials or other substrate materials exhibiting the requisite surface roughness or flatness enumerated above may be utilized and any such flat substrate material is contemplated as falling within the scope of the present invention. For example, GaAs, super-polished quartz, etc. may be utilized.

The parting layer 102 which is formed on the substrate 104 is preferably an oxide and serves as a protective layer during a subsequent processing step when the substrate 104 is later removed so as to protect a yet to be formed reflective layer. An oxide is the preferred material because it will later be removed and exhibits excellent selectivity with respect to silicon, which is commonly utilized in the yet to be formed reflective layer. Other materials, however, may be utilized as the parting layer 102 as desired and such materials are contemplated as falling within the scope of the present invention. For example, SiON, a sputtered carbon layer, etc. may be employed.

The parting layer 102 may be formed over the substrate 104 in a variety of ways. For example, the parting layer 102 may be sputtered according to conventional sputtering techniques. Sputtering the parting layer 102 is advantageous because the reflective layer, which will be formed in a subsequent processing step, is also typically formed via sputtering. Consequently, sputtering the parting layer 102 allows multiple processing steps to occur in the same processing chamber which minimizes potential contamination. Alternatively, the parting layer 102 may be formed via low pressure chemical vapor deposition (LPCVD). LPCVD processing is advantageous when the parting layer 102 is an oxide because the technique provides a high quality oxide and can form a substantially thick oxide layer relatively quickly. The parting layer 102 may also be formed via thermal growth in an oxidation furnace, for example. Thermal growth techniques are advantageous if the parting layer 102 is an oxide because they provide superior oxide quality, however, such processes are slower than LPCVD and at a certain oxide thickness, as is well known by those skilled in the art, the oxide growth slows dramatically.

Consequently, the manner in which the parting layer 102 is formed may depend upon the desired thickness of the parting layer 102. According to a preferred embodiment of the present invention, the parting layer 102 is an oxide and has a thickness of about 2,000 Angstroms, however, other thicknesses may be used and are contemplated as falling within the scope of the present invention. With a thickness of about 2,000 Angstroms, the parting layer 102 is preferably formed via sputtering to allow subsequent processing steps to be performed in the same processing chamber and because the quality of the oxide (if used as the parting layer 102) need not be of exceptional quality.

Referring again to FIG. 3, the method 100 then continues at step 106, wherein a reflective layer 108 is formed on the parting layer 102, as illustrated in FIG. 4b. Any type of reflective coating may be utilized, however, according to a preferred embodiment of the present invention, the reflective layer 108 is a multilayer molybdenum/silicon film. Preferably, the reflective layer 108 comprises eighty-one (81) thin film layers, including forty (40) layer pairs of molybdenum and silicon with a bilayer period of about 7 nm. The individual thickness of the molybdenum layers is about 3 nm and the individual thickness of the silicon layers is about 4 mn, respectively. In addition, another 4–10 nm silicon capping layer is preferably included to minimize the oxidation of the molybdenum and the individual thin film thicknesses are preferably controlled tightly to be within their target thickness ±0.1 nm in order to ensure a high reflectivity of about 65% or more.

Because the thicknesses of the various layers within the reflective layer 108 must be tightly controlled in order to provide the desired high reflectivity, it is important that the substrate 104, upon which the reflective layer 108 will be formed, is substantially flat. For example, if the substrate 104 has peaks and valleys on its surface which approach 0.1 nm rms, the uneven surface will be transferred through the various individual layers, thus negatively impacting the constructive interference within the reflective layer 108 and undesirably diminishing the reflectivity. For this reason, as discussed above, it is desirable to have a substantially flat substrate 104.

As discussed above, the reflective layer 108 is preferably a multilayer film consisting of molybdenum and silicon. Alternatively, other materials may be utilized to form a multilayer reflective film. Generally, a combination of materials which have a substantial difference in their refractive indices is desired. In addition, a transition metal element having a high melting point is often used as a material for a low refractive index layer and a semiconductor element is used as a high refractive index layer. Exemplary transition metal elements may include scandium, titanium, vanadium, chromium, iron, nickel, cobalt, zirconium, niobium, technetium, ruthenium, rhodium, hafnium, tantalum, tungsten, rhenium, osmium, iridium, platinum, copper, palladium, silver, or gold. Similarly, exemplary semiconductor materials may include a carbide, nitride or oxide of silicon, boron, beryllium or aluminum. In yet another alternative embodiment of the present invention, other reflective materials may be utilized and any such reflective material or materials is contemplated as falling within the scope of the present invention.

According to a preferred embodiment of the present invention, the individual layers of the reflective layer 108 are formed via sputtering in a dual source RF or DC magnetron sputtering system or, alternatively, via ion-beam sputtering. As is well known by those skilled in the art, a magnetron sputtering system increases the deposition rate over DC or RF diode type sputtering systems by utilizing magnetic fields to confine the secondary electrons near the sputtering target surface to thereby increase the number of electrons that cause ionizing collisions. Alternatively, however, other type sputtering systems may be utilized as well as other deposition/formation techniques such as chemical vapor deposition, etc. Any such method of forming the reflective layer 108 is contemplated as falling within the scope of the present invention.

Once the reflective layer 108 is formed over the substrate 104, a protection layer 110 is formed thereon at Step 111, as illustrated in FIGS. 3 and 4c. The protection layer 110 provides protection for the reflective layer 108 during subsequent processing when the reflective layer 108 and the substrate 104 are coupled to a low thermal expansion material, as will be discussed in greater detail infra. According to a preferred embodiment of the present invention, the protection layer 110 is an oxide formed by sputtering and preferably is about 2,000 Angstroms thick. Alternatively, the thickness of the protection layer 110 may vary, but is preferably thick enough to ensure that the surface roughness of the low thermal expansion material (which will be described infra) will not distort or otherwise translate to the reflective layer 108. Alternatively, other deposition techniques may be utilized, however, it is strongly preferred that any such processing to form the protection layer 110 occur at a temperature of less than about 150° C. in order to protect the integrity and thus the quality of the reflective layer 108 when it consists of Mo/Si multilayer. Of course, if other materials are utilized to form the reflective layer 108 which may withstand higher processing temperatures without degradation, the preferred processing temperature threshold for the protection layer 110 may be increased.

Although an oxide is the preferred material for the protection layer 110, other materials may also be utilized. In addition, any material which exhibits good adhesion to a low thermal expansion substrate (which will be described in greater detail infra) and which can be easily removed (in the event that a subsequent bonding or attachment process is insufficient and requires rework) without damaging the reflective layer 108 may be utilized and such a material or materials are contemplated as falling within the scope of the present invention.

Figure 4D:
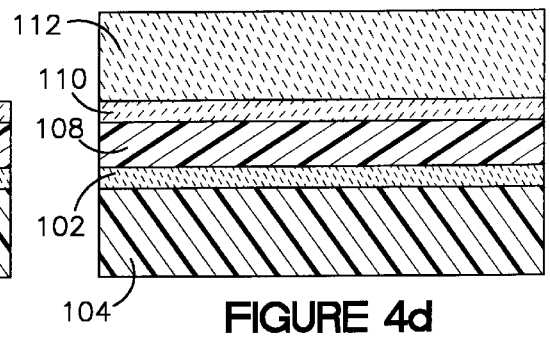

After the protection layer 110 is formed, a low thermal expansion material 112 is coupled to the protection layer 110 at step 1 14, as illustrated in FIGS. 3 and 4d. Preferably, the low thermal expansion material 112 is coupled to the protection layer 110 via bonding, however, any manner in which the two materials are attached together is contemplated as falling within the scope of the present invention. Preferably, the layers 110 and 112 are bonded together in the following manner.

One exemplary bonding method includes low temperature direct wafer type bonding. With such a bonding technique, the low thermal expansion material 112 is pressed against the protection layer 110, thereby forming a bond there between. Such direct bonding is effective for flat surfaces. If the protection layer 110 (typically formed by CVD) is too rough, a chemical-mechanical polish of the protection layer 110 may be performed prior to the bonding to decrease the surface roughness of the protection layer 110. An alternative bonding technique includes electrostatic bonding, wherein the low thermal expansion material 112 is pressed against the protection layer 110 at an elevated temperature and an electric field is applied across the materials to facilitate the bonding. Preferably, however, the elevated temperature is less than about 150° C. to minimize damage to the reflective layer during such bonding. Additional details related to bonding techniques may be found in "Silicon-on-Insulator by Wafer Bonding: A Review", W. P. Maszara, *J Electrochem. Soc.*, Vol. 138, No. 1 (January 1991) and "Electrostatic Bonding for Silicon on Glass Applications", P. T. Baine et al., *Proceedings of the 4th International Symposium on Semiconductor Wafer Bonding*, p.214 (1997) which are hereby incorporated by reference in their entirety.

According to a preferred embodiment of the present invention, the low thermal expansion material 112 is a glass material such as zerodur or ULE which is manufactured by Corning, Inc. Such glass exhibits an extremely low thermal expansion, for example, less than about 0.1 ppm/° C. as compared to silicon which exhibits a thermal expansion of about 2 ppm/° C. Alternatively, other materials which exhibit a low thermal expansion no greater than about 0.1 ppm/° C. may also be utilized and such materials are contemplated as falling within the scope of the present invention.

Figure 4E:
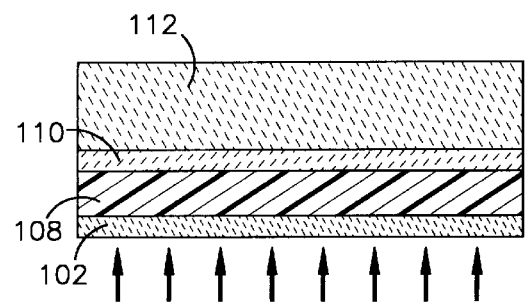

Once the low thermal expansion material 112 has been coupled to the protection layer 110 at step 114, the substrate 104 (such as silicon) is removed at step 116, as illustrated in FIGS. 3 and 4e. The preferred method of removing the substrate 104 may be a function of the material utilized as the substrate 104. For a silicon substrate (which represents the preferred substrate material), the preferred removal technique is chemical-mechanical polishing (CMP). When using CMP, the substrate 104 is exposed to a polishing pad and a slurry to thereby remove the substrate material 104 and thus expose the parting layer 102, as is well known by those skilled in the art. CMP is the preferred removal technique because the CMP process does not negatively impact the reflective layer 108. In addition, CMP allows one to monitor the output slurry, and once parting layer material is detected in the output slurry, the CMP step may be discontinued. Consequently, the CMP process provides good substrate material removal control. Alternatively, however, other removal techniques such as a dry etch or a wet etch may be utilized and are contemplated as falling within the scope of the present invention. Such techniques, however, are not preferred if the substrate 104 is silicon and the reflective layer 108 contains silicon since such an etch step may attack the silicon in the reflective layer 108 and thus possibly degrade the reflectivity of the reticle blank. Because the substrate 104 may be a silicon substrate having a thickness of up to 20 mils or more, a silicon orientation which provides the fastest removal rate is preferred for the substrate material. Since the substrate 104 will be removed, the substrate 104 is preferably is thin as possible without making the substrate 104 undesirably brittle or easy to break. Thus the thickness of the substrate 104 may be a function of the size of the reticle blank.

Figure 4F:
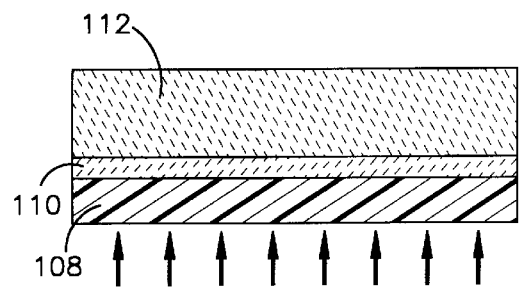

The parting layer 102 is subsequently removed at Step 118, as illustrated in FIGS. 3 and 4f. The removal Step 118 may be accomplished in a variety of ways, depending on what type of material is utilized for the parting layer 102. If the parting layer 102 is an oxide, as in the preferred embodiment of the present invention, the preferred removal technique is a wet etch using, for example, a diluted HF solution etchant with or without buffering agents. A wet etch is preferred at Step 118 due to the excellent selectivity of oxide to silicon, thus permitting the parting layer 102 to be completely removed without negatively impacting the quality and thus the reflectivity of the reflective layer 108. Alternatively, however, other layer removal techniques may be utilized, for example, a dry etch, CMP, etc., and such removal techniques are contemplated as falling within the scope of the present invention.

Figure 4G:
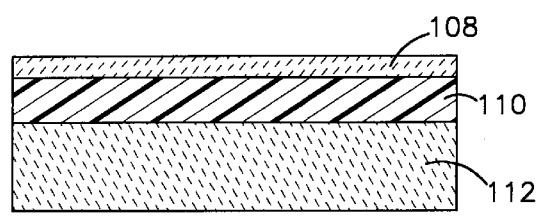

Therefore, as illustrated in FIG. 4g, the resulting structure is a reticle blank having a high reflectivity reflective layer 108 overlying a low thermal expansion material 112. Due to the high quality reflective layer 108, a high reflectivity is capable, thus improving the efficiency of the EUV lithography system. In addition, the low thermal expansion material 112 will not substantially deform over variations in temperature as is common during processing exposure. Thus the present invention overcomes the performance trade-off of prior art reticle blanks by providing both high reflectivity and low distortion during processing exposure. Of course, as in conventional EUV mask processing, a buffer layer and a patterned absorber layer may then be formed on the reflective reticle blank of the present invention.

Figure 5A:
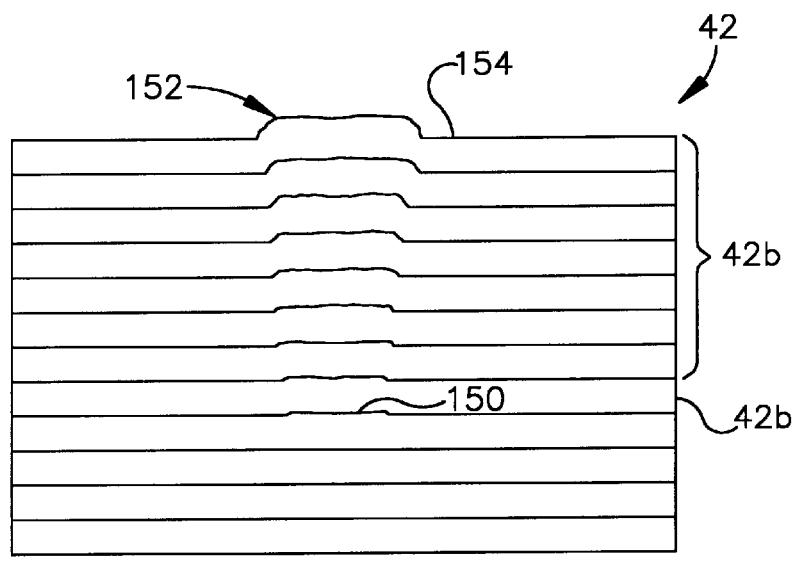
FIGS. 5a–5c are cross section diagrams illustrating a propagation of a defect in a reflective layer and the impact of any such defect propagation in a prior art EUV mask and a mask constructed in accordance with the present invention.
Figure 5B:
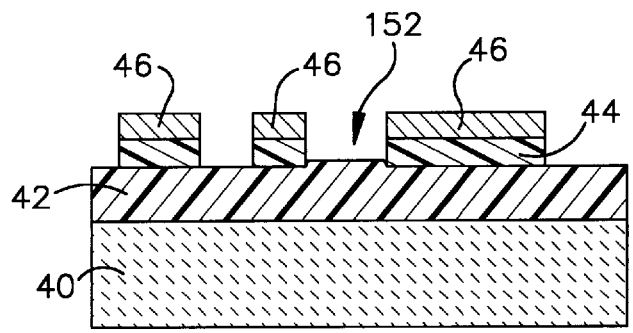

In addition to the above-described benefits, the EUV reticle blank of the present invention also either eliminates or substantially reduces the detrimental effect of defect propagation in the reflective layer in the resultant EUV reticle blank. Referring now to FIG. 5a, in constructing a reflective layer such as the layer 42, if a defect, for example, a particulate contaminant 150, forms on one of the individual sublayers 42a, other sublayers 42b which are subsequently formed above the defect 150 will propagate an "outline" of the defect upwards in an increasing manner, wherein the resultant profile 152 on a top surface 154 of the reflective layer 42 contains an exaggerated outline of the defect 150 and thus causes a reduction in the reflectivity thereof. That is, due to the conformal nature of the layers, the apparent defect size increases laterally. Such a defect propagation in a conventional EUV mask is illustrated in FIG. 5b.

Figure 5C:
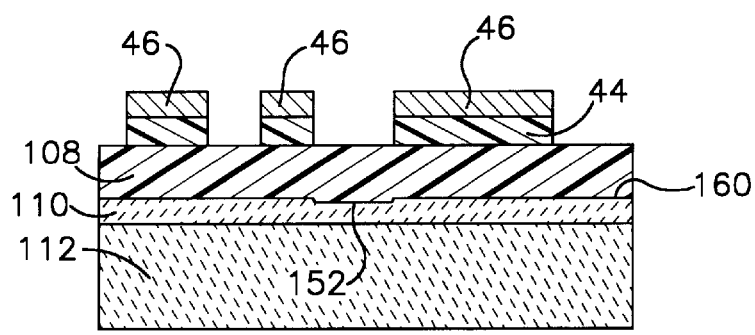

The EUV mask employing the reflective reticle blank of the present invention of FIG. 5c overcomes the disadvantages of the prior art through the back-side bonding process. As illustrated in FIGS. 4a–4g, the reflective layer 108 is formed via conventional techniques and thus any defects therein will propagate toward a "top surface" 160 of the reflective layer 108. Subsequently, however, when bonding the reflective layer 108 to the low thermal expansion substrate 112 via the protection layer 110, the reflective layer 108 is flipped over so that the "top surface" 160 now has become the "bottom surface" 160 of the reflective layer 108. Consequently, any defect propagation in the reflective layer 108 of the present invention propagates "down" toward the low thermal expansion substrate 112 instead of "up" toward the patterned absorbing layer 46. Therefore any defect propagation which may exist does not substantially impact the reflectivity of the reflective layer 108.

Please note that any defect in the reflective layer 108 may adversely impact the reflectivity thereof, however, the contribution of the top ten reflective layer pairs (sub-layers) is greater than the contribution of the remaining thirty reflective layer pairs for those reflective layers employing forty such reflective layer pairs. Thus the "downward" defect propagation of the present invention provides for an elimination or a substantial reduction in reflectivity degradation. Therefore the present invention further provides for improved performance over the prior art.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a reticle blank, comprising the steps of:

forming a parting layer over a flat substrate;

forming a reflective layer over the parting layer;

forming a protection layer over the reflective layer;

coupling a low thermal expansion material to the protection layer, wherein the protection layer protects the reflective layer from damage during the coupling of the low thermal expansion material;

removing the flat substrate, wherein the parting layer protects the reflective layer from damage during the removal of the flat substrate; and removing the parting layer.

2. The method of claim 1, wherein the parting layer is an oxide.

3. The method of claim 2, wherein the step of forming the oxide includes one of sputtering the oxide, forming the oxide using low pressure chemical vapor deposition, and thermal growth.

4. The method of claim 1, wherein the reflective layer comprises a multilayer film.

5. The method of claim 4, wherein the multilayer film includes molybdenum and silicon.

6. The method of claim 4, wherein the multilayer film comprises a plurality of film pairs, and wherein one of the layers in the film pairs comprises molybdenum and the other comprises silicon.

7. The method of claim 6, wherein the molybdenum layers have a thickness of about 3 nm and the silicon layers have a thickness of about 4 nm.

8. The method of claim 7, wherein the layers are formed via sputtering in a dual source RF or DC magnetron sputtering system.

9. The method of claim 1, wherein the protection layer comprises an oxide.

10. The method of claim 9, wherein the step of forming the oxide includes one of sputtering the oxide, forming the oxide using low pressure chemical vapor deposition, and thermal growth.

11. The method of claim 1, wherein the step of coupling the low thermal expansion material to the protection layer comprises bonding the low thermal expansion material to the protection layer.

12. The method of claim 1, wherein the low thermal expansion material comprises one of zerodur and ULE glass by Corning, Inc.

13. The method of claim 1, wherein removing the semiconductor substrate comprises etching the semiconductor substrate with a chemical-mechanical polish process.

14. The method of claim 1, wherein removing the parting layer comprises etching the parting layer with an etch having a high selectivity with respect to the reflective layer.

15. The method of claim 14, wherein the etch comprises a wet etch and wherein the etchant comprises an HF solution.

16. The method of claim 14, wherein the flat substrate comprises a semiconductor material.

17. The method of claim 16, wherein the semiconductor material comprises silicon.

18. The method of claim 1, wherein the flat substrate has a surface roughness of less than about 3 Angstroms rms.

19. The method of claim 1, wherein a thermal expansion coefficient of the low thermal expansion material is less than a thermal expansion coefficient of the flat substrate.

20. A method of forming a reflective reticle blank, comprising the steps of:

forming a reflective layer over a flat substrate;

coupling a low thermal expansion material to the reflective layer; and removing the flat substrate, thereby forming a low-defect reflective layer due to the flatness of the flat substrate and exhibiting minimized distortion during processing due to the low thermal expansion material.

21. A reflective reticle blank, comprising:

a substrate having a low thermal expansion coefficient in a range of less than about 0.1 ppm/° C., and having a surface flatness in a range of greater than about 3 Angstroms rms; and a reflective layer coupled to the substrate at the surface, and having a surface flatness substantially less than the surface flatness of the substrate.

22. A reflective reticle blank, comprising:

a substrate; and a reflective layer overlying the substrate, wherein the reflective layer has a top surface which faces away from the substrate and a bottom surface which faces the substrate, and wherein a defect propagation in the reflective layer propagates toward the bottom surface.

23. A method of forming a reflective reticle blank, comprising:

forming a reflective layer over a first substrate;

forming a second substrate over the reflective layer; and removing the first substrate.

* * * * *

UNITED STATES PATENT AND TRADEMARK OFFICE
CERTIFICATE OF CORRECTION

PATENT NO.: 6,048,652

DATED: April 11, 2000

INVENTOR(S): Khanh B. Nguyen
Craig Sander

It is certified that error appears in the above-identified patent and that said Letters Patent is hereby corrected as shown below:

Column 1, line 19, please replace the word "comers" with the word --corners--.

Column 7, line 24, please replace the numeral "1 14" with the numeral --114--.

Signed and Sealed this

Thirtieth Day of January, 2001

*Attest:*

Q. TODD DICKINSON

*Attesting Officer*  *Director of Patents and Trademarks*